US012694168B2

(12) United States Patent
Nicoletti et al.

(10) Patent No.: US 12,694,168 B2
(45) Date of Patent: Jul. 28, 2026

(54) SIMULATION OF THE BEHAVIOR OF A VEHICLE IN A FLUID BY HAMILTONIAN NEURAL NETWORK

(71) Applicant: BULL SAS, Les Clayes Sous Bois (FR)

(72) Inventors: Léo Nicoletti, Toulouse (FR); Alexis Giorkallos, Montaud (FR); Gaël Goret, Réaumont (FR)

(73) Assignee: BULL SAS, Les Clayes sous Bois (FR)

( * ) Notice: Subject to any disclaimer, the term of this patent is extended or adjusted under 35 U.S.C. 154(b) by 1186 days.

(21) Appl. No.: 17/574,829

(22) Filed: Jan. 13, 2022

(65) Prior Publication Data

US 2022/0229948 A1 Jul. 21, 2022

(51) Int. Cl.
*G06F 30/15* (2020.01)
*G06F 30/27* (2020.01)
*G06F 30/28* (2020.01)

(52) U.S. Cl.
CPC .............. *G06F 30/15* (2020.01); *G06F 30/27* (2020.01); *G06F 30/28* (2020.01)

(58) Field of Classification Search
CPC ...... G06F 30/27; G06F 30/28; G06F 2113/08; G06F 2111/10
See application file for complete search history.

(56) References Cited

U.S. PATENT DOCUMENTS

| | | | | |
|---|---|---|---|---|
| 2019/0005185 A1* | 1/2019 | D'Antuono | .............. | G06F 30/15 |
| 2019/0050506 A1* | 2/2019 | Umetani | ................. | G06T 19/20 |
| 2019/0354657 A1* | 11/2019 | Placko | .................... | G06F 30/23 |
| 2020/0387579 A1* | 12/2020 | Barr | ........................ | G06F 30/27 |
| 2021/0157962 A1* | 5/2021 | Baqué | ..................... | G06F 30/17 |

OTHER PUBLICATIONS

Kingma et al., "Adam: A Method for Stochastic Optimization", ICLR, 2015, pp. 1-13 [retrieved from https://www.semanticscholar.org/reader/a6cb3667367691bcccc5c8639de5a8f9636bf87e8]. (Year: 2015).*
Singh, "Mastering Tanh: A Deep Dive into Balanced Activation for Machine Learning" (Nov. 10, 2024), pp. 1-17 [retrieved from https://medium.com/ai-enthusiast/mastering-tanh-a-deep-dive-into-balanced-activation-for-machine-learning-4734ec147dd9]. (Year: 2024).*
European Search Report for corresponding EP Application No. 21305044, dated Jun. 21, 2021.

(Continued)

*Primary Examiner* — Brian W Wathen
(74) *Attorney, Agent, or Firm* — Meagher Emanuel Laks Goldberg & Liao LLP

(57) ABSTRACT

A method for simulating the behavior of a system (20) composed of a subsystem (10), such as an aerial vehicle, in a physical environment (21) made of an incompressible fluid, comprising
training a multilayer neural network (HNN) by means of a training set associating coordinates (x, y) in said physical environment (21) and respective values of a gradient of the current function ($\psi$) at said coordinates (x,y), and a loss function configured to minimize an error between a gradient ($S_\psi$) of the output of said neural network and said gradient of the current function;
using said neural network to predict a value of a current function ($\psi$) and a velocity field (u) by providing it with input coordinates.

15 Claims, 3 Drawing Sheets

(56) References Cited

OTHER PUBLICATIONS

Rao et al., "Physics-informed deep learning for incompressible laminar flows", arxiv.org. Cornell University Library, 201 Olin Library Cornell University Ithaca, NY, 14853, Feb. 24, 2020 (Feb. 24, 2020), XP081607268.

Wandel et al., "Unsupervised Deep Learning of Incompressible Fluid Dynamics", arxiv.org. Cornell University Library, 201 Olin Library Cornell University Ithaca, NY, 14853, Jun. 15, 2020 (Jun. 15, 2020), XP081696810.

Kim et al., "Deep Fluids: Generative Network for Parameterized Fluid Simulations", arxiv.org. Cornell University Library, 201 Olin Library Cornell University Ithaca, NY, 14853, Jun. 6, 2018 (Jun. 6, 2018), XP081021594.

Wang et al., "Understanding and mitigating gradient pathologies in physics-informed neural networks" arxiv.org. Cornell University Library, 201 Olin Library Cornell University Ithaca, NY, 14853, Jan. 13, 2020 (Jan. 13, 2020), XP081578179.

\* cited by examiner

SIMULATION OF THE BEHAVIOR OF A VEHICLE IN A FLUID BY HAMILTONIAN NEURAL NETWORK

FIELD OF THE INVENTION

This invention relates to the simulation of a system comprising subsystems modeled by physical laws. In particular, it may relate to the simulation of the behavior of all or part of a vehicle, for example for vehicle design purposes in order to study the behavior thereof.

More specifically, the invention proposes a method for simulating the behavior of all or part of a vehicle, in particular an aerial vehicle, within a system, by substituting computations based on modeling by physical laws with predictions based on a model made up of a multilayer neural network.

BACKGROUND OF THE INVENTION

The design of a vehicle, especially an aerial vehicle such as a helicopter or an airplane, is a complex process involving many people over many years and a significant budget, whether it is a question of designing an aircraft, a new vehicle, or a new version of an existing vehicle.

Computational tools, in particular simulation, make it possible to minimize these costs, by making it possible to test different configurations of the design of elements of the vehicle depending on the environment, this environment comprising in particular the other elements of the vehicle as well as the physical constraints due to the coupling of the vehicle with the external environment (in particular the friction boundary layer of the air around a wing). These simulations are based on physical models describing the behavior, in particular the aerodynamic behavior, of the various elements of the vehicle as a function of its environment and of the interfaces between the vehicle and the environment.

Simulations may determine the impact of each design choice and thus explore a greater number of possibilities than would be possible to do in real tests. It is in particular possible to determine the impact of each choice for a component of the vehicle on the entire vehicle and, in particular, to draw conclusions on the overall manufacturing cost, on energy consumption, on the noise generated, etc. In manufacturing engineering, this iterative process is called generative design.

However, this problem is extremely complex, because an aerial vehicle is, in itself, a complex system made up of very many different components. In addition, their interactions and the interactions with the environment are numerous and difficult and expensive to model accurately by physical laws. In addition, the dynamic aspect of the environment must be taken into account since an aerial vehicle passes through different phases during a flight (climb, hover, descent, landing, etc.), each involving different physical (in particular aerodynamic) constraints on the device.

Despite the increase in power of information processing platforms, a compromise must traditionally be made between the precision of the physical models describing the behavior of each element of the simulated vehicle and the computing cost of the simulation (cost of the platform and processing time).

Thus, some physical models used in computational fluid dynamics (CFD) such as those based on the Navier-Stokes equations, remain too expensive, in terms of computation time, to be able to be used in industrial simulation. In addition, the existence of a solution has not been demonstrated and is even the subject of a call to the mathematical community.

Consequently, approximations are generally used. The use of the Reynolds decomposition applied to the solutions of the Navier-Stokes equation makes it possible to simplify the problem by eliminating the fluctuations of short periods and amplitudes. The method is known by the name of Reynolds average or by the term RANS for "Reynolds-averaged Navier-Stokes," or even "averaged Navier-Stokes equation." However, this simplification of set computations comes at the expense of precision.

These issues related to the practical implementation of the physical modeling of the constituent elements of an airplane are for example presented in the article by A. Abbas-Bayoumi and K. Becker, "*An industrial view on numerical simulation for aircraft aerodynamic design,*" In Journal of Mathematics in Industry, 1 (1): 10, 2011. doi: 10.1186/2190-5983-1-10.

It has been proposed to replace certain physical models of the simulation with models based on machine learning.

The article "*A Machine Learning Based Body Force Model for Analysis of Fan-Airframe Aerodynamic Interactions*" by Luis Lopez de Vega, Guillaume Dufour, Florian Blanc and William Thollet, in Global Power and Propulsion Society Conference 2018, 7 May 2018-9 May 2018 (Montreal, Canada), proposes in particular to replace a machine learning model in part of the turbulence modeling with the Reynolds method. The model in question is a multi-layered perceptron neural network. The article also shows the problems of precision of the neural model and in particular proposes a method for improving its precision.

However, this work does not target all the problems confronting the simulation of a complex system, and, in particular, the simulation of certain variables of the simulation of the fluid in which the vehicle is immersed.

In particular, the current function of the fluid needs to be calculated at any point in the fluid, which generates a significant computational cost.

SUMMARY OF THE INVENTION

An object of this invention is to provide a simulation method and device that at least partially overcomes the aforementioned drawbacks.

More particularly, according to the embodiments, it aims to provide a simulation of the current function based on a multilayer neural network. Said neural network makes it possible to shift the computational cost to a learning phase (which is carried out upstream and does not impact said simulation), and to provide a constant computation time during the simulation using the network in inference mode.

Also, the invention is based on a neural network trained with a particular loss function and based on the physical reality of the simulated fluids.

More precisely, an implementation of the invention proposes a method for simulating the behavior of a system composed of a subsystem, such as all or part of an aerial vehicle, in a physical environment made up of an incompressible fluid, entailing training a multilayer neural network by means of a training set associating x, y coordinates in said physical environment and respective values of a gradient of the current function $\psi$ at said x, y coordinates, and a loss function configured to minimize an error between a gradient $S_\psi$ of the output of said neural network and said gradient of the current function;

the use of said neural network to predict a value of a current function ψ and of a velocity field by providing it with coordinates as input.

According to preferred embodiments, the invention comprises one or more of the following features which may be used separately or in partial combination with one another or in total combination with one another:

$$\mathcal{L} = \left\| \frac{dx}{dt} - \frac{d\psi}{dy} \right\|^2 + \left\| \frac{dy}{dt} + \frac{d\psi}{dx} \right\|^2$$

the loss function L is expressed as where t represents the time;

the training set is generated by determining the value ψ(x,y,t) of said current function, for coordinates, x,y chosen randomly in said physical environment; the time of interest t of a simulation may for example be fixed (referred to as a "snapshot") for the rest of the modeling.

the value ψ(x,y,t) is determined on the basis of a physical model used in computational fluid dynamics, CFD, such as those based on the Navier-Stokes equations;

the aerial vehicle is an airplane. It may also be a helicopter, drone, etc., or parts of said vehicle (rotor, etc.). Applications outside the aviation sector are also possible.

According to an embodiment, the invention also relates to a computer program comprising instructions which, when the program is executed by a computer, lead said computer to implement the method described above.

According to another embodiment, the invention also relates to a device for simulating the behavior of a system composed of a subsystem, such as all or part of an aerial vehicle, in a physical environment consisting of an incompressible fluid, comprising means for training a multilayer neural network by means of a training set associating x, y coordinates in said physical environment and respective values of a gradient of the current function ψ at said x, y coordinates, and a loss function configured to minimize an error between a gradient $S_\psi$ of the output of said neural network and said gradient of the current function; and for using said neural network to predict values of a current function ψ and a velocity field u by providing it with input coordinates.

According to preferred embodiments, the invention comprises one or more of the following features which may be used separately or in partial combination with each other or in total combination with one another:

the loss function L is expressed $$\mathcal{L} = \left\| \frac{dx}{dt} - \frac{d\psi}{dy} \right\|^2 + \left\| \frac{dy}{dt} + \frac{d\psi}{dx} \right\|^2$$

where t represents the time;

the device further comprises means for generating said training set by determining the value ψ(x,y,t) of said current function, for coordinates, x,y chosen randomly and at the time t in said physical environment; this time may be fixed later in the simulation.

the value ψ(x,y,t) is determined on the basis of a physical model used in computational fluid dynamics, CFD, such as those based on the Navier-Stokes equations;

the aerial vehicle is an airplane; it may also be a helicopter, drone, etc., or parts of said vehicle (rotor, etc.). Applications outside the aviation sector are also possible.

The device further comprises an interface for retrieving said coordinates and providing said values to a simulation tool.

According to an embodiment, the invention also relates to a server or a set of servers, implementing a device as described above and comprising interfaces making it possible to provide it in the form of a service available via a computer cloud.

Other features and advantages of the invention will become apparent on reading the following description of a preferred embodiment of the invention, given by way of example and with reference to the appended drawings.

DETAILED DESCRIPTION OF EMBODIMENTS OF THE INVENTION

The invention may be applied to any simulation of a complex system modeled by physical laws of behavior, and in particular by laws of fluid dynamics. By way of non-exhaustive examples, it may thus relate to the simulation of meteorological systems or, for example, the behavior of ocean currents or even the behavior of a solid subsystem with respect to an environment made up of a fluid medium.

The latter case may concern a subsystem such as a wind turbine in the fluid medium of air, or other devices operating in a similar manner, i.e., with blades immersed in a fluid flow: radial and axial compressors in aircraft turbojets, air conditioning systems, gas pipelines, turbochargers, etc.

The invention may also be applied to different types of vehicles, the behavior of which is to be studied when moving in a fluid (typically the earth's atmosphere). Aerial vehicles (planes, drones, helicopters, etc.) at subsonic speed may be mentioned in particular, or aerodynamic parts of such a vehicle, (or "airfoil"), such as for example an airplane wing, a helicopter rotor blade, a turbojet compressor or helicopter turbine ("turboshaft") blade, etc.

As was seen in the introduction, the simulation of the behavior of vehicles within a fluid (the atmosphere at subsonic speeds) by the physical laws of aerodynamics generates difficulties in implementation, in particular in terms of precision and processing cost.

Figure 1:
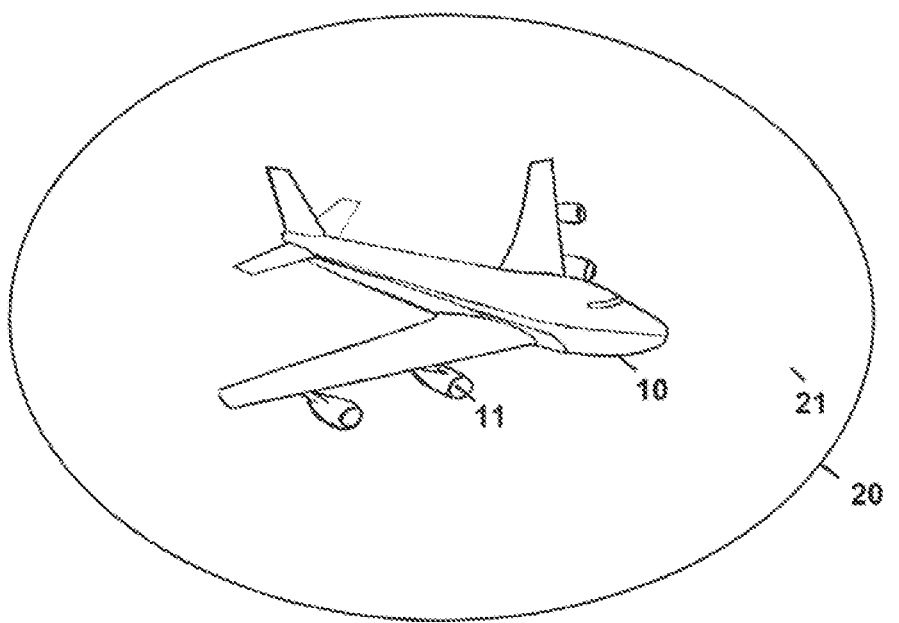
FIG. 1 schematically represents an example of a system composed of an aerial vehicle and its environment according to an embodiment of the invention.

FIG. 1 illustrates an example of application to an aerial vehicle such as an airplane, without loss of generality.

The method and the device according to the invention aim to simulate the behavior of a system 20 composed of the aerial vehicle 10 in its ambient physical environment 21. In effect, in order to simulate the behavior of the aerial vehicle 10, it is also necessary to simulate the interactions between said vehicle and its environment and in particular the influence of the airplane on its environment.

Said simulation of the "vehicle" sub-system 10 therefore involves the simulation of the overall system 20, and, therefore, the "atmosphere" sub-system 21.

Said system may be simulated by software tools implementing techniques of computational fluid dynamics, CFD, in order to determine the interactions between the vehicle 10, or certain parts 11 of the vehicle, such as a nozzle of a turbojet, and the physical environment 21 in which it circulates.

Mention may be made for example of the software sold by the company Dassault Systemes, such as the software product "Simulia." The "Flow Simulator" software from the company HyperWorks, with various physical simulation modules ("elsA" produced by ONERA, "Su2" from Stanford University, etc.), or the AVBP software developed by CERFACS (European Center for Research and Advanced Training in Scientific Computing) may also be cited.

Computational Fluid Dynamics (CFD) consists of studying the motions of a fluid (e.g., air) and their effects by computationally solving the equations governing the fluid. Depending on the approximations chosen, which are generally the result of a compromise in terms of the needs of physical representation with respect to the available computation or modeling resources, the solved equations may be the Euler equations, the Navier-Stokes equations, etc.

In general, the resolution of a computational fluid dynamics problem involves the preparation of the problem: this is done by defining a geometry, a mesh discretizing the field of computation, the choice of the models and computational methods employed;

the computational resolution of the problem which involves the execution of a computer program implementing a mathematical modeling of the behavior of the system 20.

Other aspects of the behavior of the system 20 may also be considered such as for example the thermal aspects.

In general, this technique based on fluid dynamics aims to provide a model based on physical laws of behavior, i.e., to approximate the behavior of the system by physical laws or equations. By applying these laws, or equations, the behavior of the system may be estimated.

Meshing entails dividing the space into cells called "control volumes." Meshing is often tricky in fluid dynamics because it is necessary to mesh the entire space of the system 20, including the "empty" space formed by the physical environment 21. This therefore results in a large volume of mesh.

In addition, surface details are important since they may generate turbulence. This results in the need for a very fine mesh, in particular around the surfaces (that is to say at the interface between the aircraft 10 and the physical environment 21).

Consequently, meshes containing a large number of cells (typically several million) are thus often obtained.

In addition, while in resistance of materials a hexahedral mesh of the space is an interesting strategy (it allows the same quality of results for a smaller number of nodes to be obtained), in computational fluid dynamics, this introduces preferred directions which may have an influence on the result.

Also, other types of mesh are possible, such as the hexahedral mesh, and non-uniform meshes, allowing different resolutions or different typologies or orientations, according to the zones. For example, it is possible to have in the vicinity of the surfaces (aircraft/environment interfaces), a mesh parallel to the surface—hexahedral or prismatic (hexahedra cut in half)—and with a small thickness (three layers of cells for example);

at the heart of the volumes, a tetrahedral mesh but having no particular direction, and for example, of lower resolution.

Certain systems 20 to be simulated may be extremely complex and involve various physical phenomena. This is the case notably of an aerial vehicle such as an airplane which generates different physical problems: lift of the wings, turbulence at the levels of the inlet (fan) and the outlet (nozzles) of the turbojets, boundary layer around an aircraft, etc.

Consequently, the system may be broken down into a plurality of physical models, some of these models being able to be dedicated or adapted to a part of the system 20.

For example, turbulence phenomena at the inlet or outlet of the turbojets have been the subject of specific studies on the aerodynamic phenomena involved.

A fairly widely used approach is the body force model (BFM), which aims to replace the turbojet blades with equivalent force fields. This model was proposed by Marble, F. E, 1964, *"Three-Dimensional Flow in Turbomachine"* in High Speed Aerodynamics and Jet Propulsion, Vol. 10, Sec. C, Princeton University Press, pp. 83-166. It has been widely applied since, as for example reported in Hsiao, E., Naimi, M., Lewis, J. P., Dalbey, K., Gong, Y. et Tan, C., *"Actuator Duct Model for Turbomachinery Components for Powered-Nacelle Navier-Stokes Calculations,"* Journal of Propulsion and Power, vol. 17, no. 4, July-August 2001, or also Thollet, William and Dufour, Guillaume and Carbonneau, Xavier and Blanc, Florian *"Body-force modeling for aerodynamic analysis of air intake—fan interactions"* in (2016) *International Journal of Numerical Methods for Heat & Fluid Flow*, vol. 26 (n° 7). pp. 2048-2065. ISSN 0961-5539. One of the advantages of this model is its integration in computational fluid dynamics simulators, in particular in the Navier-Stokes equations calculated by Reynolds average (RANS model).

Certain models may relate to the simulation of the environment 21, i.e., of a fluid (in interaction with a solid subsystem, such as an aerial vehicle).

These models require the computation of many variables, in order to capture a simulated state of the system. As has been seen previously, some of these variables, such as the current function, generate computation times which pose problems in meeting the requirements of a simulation within acceptable times.

According to an aspect of the invention, the computation of this current function by the usual techniques using models based on physical laws of behavior according to fluid dynamics (CFD) is replaced by a particular multilayer neural network.

This computation, based on a prediction by a neural network, may interface with the other components of a simulation tool like a black box: the simulator submits input data (in particular, the coordinates of the point in which the current function must be calculated) and retrieves the value of this current function at the output. This is referred to as "coupling" of a physical solver with a machine learning inference engine.

In a very macroscopic way, multilayer neural networks may be viewed as black boxes, the internal parameters of which must be adjusted during a learning or training phase by introducing to them both input data and a desired output (or "label"). The error between this desired output and the "natural" output of the network makes it possible to slightly adjust the parameters to reduce the error. By introducing a large number of these "input data/desired output" pairs, the network learns to react correctly and to provide good output when presented with new, unlabeled input data.

According to an embodiment of the invention, the neural network used may be a multilayer perceptron. Other neural network architectures may be possible. In particular, a convolutional neural network may be used (ConvNet or CNN).

Figure 2:
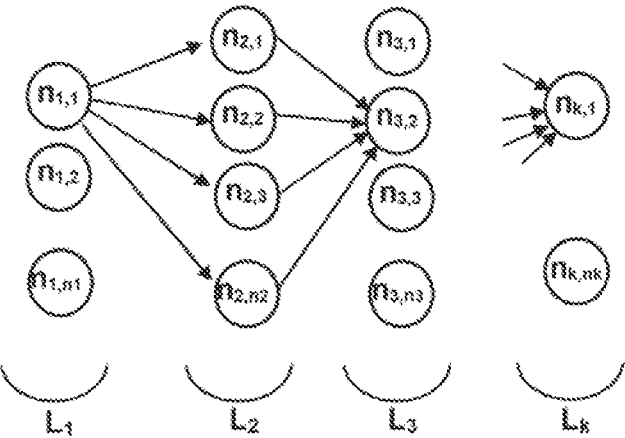
FIG. 2 schematically illustrates a multilayer neural network such as may be used within the framework of an implementation according to an embodiment of the invention.

An example of a multilayer neural network is shown in FIG. 2.

The multilayer perceptron (or MLP) is a type of artificial neural network organized in several layers within which information circulates from the input layer $L_1$ to the output layer $L_k$ only; it is therefore a direct propagation network ("feedforward"). Each layer $L_1$, $L_2$, $L_3$ . . . $L_k$ is comprised of a variable number of neurons, respectively $n_1$, $n_2$, n . . . $n_k$. The neurons of the last layer (said "output") are the outputs of the neural network and representative of a prediction of the model in response to an input provided on the layer $L_1$.

In a multilayer perceptron, each neuron $n_{i,j}$ is connected at the output to all the neurons of the following layer $L_{i+1}$. Conversely, it receives as input the outputs of all the neurons of the previous layer $L_{i-1}$. In FIG. 2, for clarity, only a few connections are represented by the directional arrows.

Each connection is associated with a weight. The set of weights form the internal parameters of the neural network. They must be determined during a learning (or training) phase and then make it possible to predict output values, by generalization, from a new input vector presented on the input layer $L_1$.

Each neuron $n_{i,j}$ conventionally adds these inputs weighted by the weights of the associated connections and then applies an activation function to this total.

Several techniques exist for determining the internal parameters of the network, the thresholds, by learning. In particular the algorithm of the stochastic gradient descent (SGD) may be cited, which is described for example in LeCun, Yann A., et al. "*Efficient backprop. Neural networks: Tricks of the trade*," Springer Berlin Heidelberg, 2012. 9-48. ADAM, described initially in Diederik P. Kingma and Jimmy Lei Ba may also be cited. "*Adam: A method for stochastic optimization*". 2014. arXiv: 1412.6980v9, or RMSprop, described notably in Tijmen Tieleman and Geoffrey Hinton, "*Lecture 6.5-rmsprop: Divide the gradient by a running average of its recent magnitude*," COURSERA: neural networks for machine learning, 4(2):26-31, 2012.

One of the aspects of the invention consists in allowing the learning and the determination of all the parameters of the multilayer neural network. The parameters of the neural network comprise in particular the internal parameters, or weights, associated with the connections between neurons. These weights (or synaptic weights) are determined iteratively by learning, or training, as previously described.

In general, the multilayer neural network is trained by means of training (or learning) data coming either from the physical world (that is to say measurements), or from a modeling of the physical world, that is to say of a model based on physical laws of behavior as previously mentioned. It is thus possible to train the neural network on the basis of a training set generated by the simulation of a known physical dynamic, for example based on computational fluid dynamics (CFD).

Behavioral Physical Modeling

This simulation may be based on the Navier-Stokes equations which describe the behavior of a fluid, as previously mentioned.

It is possible to assume that on the one hand there is no heat dissipation and on the other hand the fluid is incompressible, that is to say that the mass density p of the fluid is constant. This assumption appears reasonable for vehicle speeds not exceeding a few Mach numbers, which remains acceptable in many aeronautical study cases. One may thus write $\nabla \cdot u = 0$ According to this double assumption, these Navier-Stokes equations may be expressed according to the following Eulerian formulation:

$$\dot{u} + u \cdot \nabla u = -\frac{1}{p} \nabla p + v \nabla^2 u$$

in which u represents a vector which is a function of the x, y coordinates of a point on a modeled 2D surface, and of time, p is a scalar which is also a function of the x, y coordinates and of the time t; v is the kinematic viscosity and $\nabla$ is the gradient operator, which corresponds to a Laplacian when applied twice.

The vector field u represents the speed (or velocity) field of the fluid in a space (x,y).

Under the incompressibility assumption, this equation may be rewritten according to the Hodge-Helmholtz decomposition:

$$u = \nabla \Phi + \nabla \times \vec{\psi}$$

The Helmholtz-Hodge theorem, also called the fundamental theorem of vector calculus, ensures that a vector field is decomposed into a "longitudinal" (irrotational) component and a "transverse" (solenoidal) component, i.e., the sum of the gradient of a scalar field and the curl of a vector field.

This equation thus highlights a velocity potential (a scalar value) $\Phi$ which represents the irrotational part of the velocity vector field u; and a current function $\psi$ (or "streamfunction"), representing the solenoidal part of the vector field u.

"Vorticity", or vorticity vector, m, may thus be defined as the curl of the velocity field u of the fluid.

$$\omega = \nabla \times u$$

The vortex is a vector quantity, the direction of which is along the axis of rotation of the fluid. Thus, for any two-dimensional flow, the vortex vector is found in the axis perpendicular to the plane of rotation.

By taking the curl of the Navier-Stokes equation, the vortex equation is obtained:

$$\dot{\omega} + u \cdot \nabla \omega = v \nabla^2 \omega$$

It may be noted that the contribution of Vp in the Navier-Stokes equation no longer appears since the curl of a gradient is always zero.

This equation may be interpreted by defining the material derivative (or substantial derivative, or even "derivative according to the motion"), $D\omega/Dt$. This quantity represents the rate of change of vorticity with respect to the velocity field u.

$$\frac{D\omega}{Dt} = \dot{\omega} + u \cdot \nabla \omega$$

In this expression, the quantity u·∇ω represents the advective part of the variation (i.e., related to the displacement of the fluid).

If it is assumed that the density of the fluid is constant, the rate of change of vorticity is simplified by expressing it only with respect to the force of viscosity:

$$\frac{D\omega}{Dt} = v \cdot \nabla \omega$$

It should be noted that v represents the kinematic viscosity.

Moreover, by taking the curl of the Helmholtz-Hodge decomposition, we obtain Poisson's equation for the current function:

$$\omega = -\nabla^2 \psi = \nabla \psi$$

By combining this last equation with the previously formulated vortex equation, the following is obtained:

$$\begin{cases} \dot{\omega} + (\nabla \times \psi), \nabla \omega = v\nabla^2 \omega \\ \nabla \psi = -\omega \end{cases}$$

A system of two equations with two unknowns is thus obtained: the vorticity w and the current function ψ.

This system may be solved by different numerical methods. In particular, the FTCS method (Forward-Time Central-Space scheme) described in the document "PyCFD—A Pythonic introduction to numerical techniques used in computational fluid dynamics," accessible on the website http:ohllab.org/CFD court/may be used.

This method consists in discretizing these equations according to the spatial coordinates (x, y) and according to the time t, according to a constant mesh Δx, Δt. At each time iteration, Poisson's equation may be solved by the Jacobi iterative method: given a vorticity field m, it is possible to optimize an estimate of the current function by successive approximations. The aforementioned document provides, in chapter 5, "*Vorticity-Streamfunction Formulation*,"a code in Python language to do this.

Multilayer Neural Network Learning

It should be noted that the current function ψ may be expressed according to the Helmholtz-Hodge decomposition.

$$u = \nabla\Phi + \nabla \times \vec{\psi}$$

In the case of a surface field, Lamb and Batchelor have defined this function, for an incompressible fluid (such as the atmosphere) by the expression:

$$\psi = \int_{0,0}^{x,y} (u_x dy - u_x dx)$$

The current function is considered to have only one component according to the normal to the plane (x,y). The vector $\vec{\psi}$ may therefore be replaced by the scalar value ψ on this normal axis.

The velocity field is tangent to constant current field lines. These lines are conventionally called current lines and correspond to the trajectories of the particles of the fluid.

Under the assumption of non-divergence, due to the non-compressibility of the fluid, one may write $$\begin{cases} \dot{x} = u_x = \dfrac{d\psi}{dy} \\ \dot{y} = u_y = -\dfrac{d\psi}{dx} \end{cases}$$

It should be noted that this system corresponds to a Hamiltonian structure according to the spatial coordinates x,y.

Hamiltonian mechanics is a reformulation of Newtonian mechanics. It was formulated by William Rowan Hamilton in 1833 from Lagrange's equations and its formalism notably facilitated the theoretical development of quantum mechanics.

Hamilton's equations associate with each point (x,y) of a space a value, called a "Hamiltonian" and represented with H. The Hamiltonian of a system has been shown to be equal to its total energy, i.e., the sum of kinetic energy and potential energy.

The current function ψ being expressible as a Hamiltonian, therefore represents an energy of the system, and the current lines represent places of constant energy, i.e., within which the particles of the fluid may move.

These current lines are defined by the symplectic gradient of the Hamiltonian (ẋ, ẏ), with $$\begin{pmatrix} \dot{x} \\ \dot{y} \end{pmatrix} = \begin{pmatrix} \dfrac{d\psi}{dy} \\ -\dfrac{d\psi}{dx} \end{pmatrix}$$

The symplectic gradient therefore makes it possible to define the current lines as the place where the gradient is zero and, therefore, where the current function (Hamiltonian) is constant. These current lines represent the place where movements are physically possible for the particles of the fluid, by virtue of the principle of least action.

In other words, it may be noted that the velocity field u ($u_x$, $u_y$) is the symplectic gradient of the current function.

This property may be exploited to guide the learning of the multilayer neural network. More specifically, a multilayer neural network is trained in order to replace the computation of the current function ψ, by giving it examples not of what its outputs (ψ) should be, but of what the derivatives ($u_x$, $u_y$) of its outputs should be.

In other words, the training set is structured to have the derivative of the current function, for each point x,y, of the set, and a loss function is determined to measure a difference between the derivative of the output of the neural network and the derivative provided in the training set. This difference may then be the object of a back-propagation of its gradient (it therefore concerns a gradient of gradient), in order to iteratively develop the synaptic weights of the multilayer neural network until a model is built that may be used in prediction to provide, on the one hand, the current function and its gradient, the velocity field.

Figure 3:
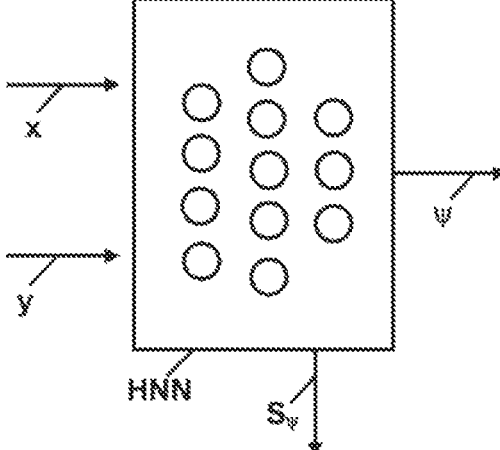
FIG. 3 schematically illustrates a simulation device according to an embodiment of the invention.

FIG. 3 illustrates the use of a neural network according to an embodiment.

The structure of the HNN neural network may vary. As an example, a network of 3 densely connected layers may be considered. The hidden layer may for example comprise 200 neurons. The activation function may be the tanh function. Optimization with the Adam method ("adaptive moments") also may be used. This is described in the article by Diederik P. Kingm and Jimmy Ba, "*Adam: A method for stochastic optimization*", arXiv: 1412.6980, 2014.

The x,y coordinates of a point in the space of the fluid to be simulated are introduced at the input of the neural network HNN. The neural network is trained so that its output is the current function $\psi$.

Also, if the x,y coordinates of points belonging to a same current line are introduced as input, the output of the neural network will be constant.

As it has been possible to feature a Hamiltonian expression of the current function, it is possible to take advantage of it to use a Hamiltonian neural network.

Hamiltonian neural networks were described in the seminal article by Sam Greydanus, Misko Dzamba and Jason Yosinski, "*Hamiltonian Neural Networks*", CoRR, abs/1906.01563, 2019.

A Hamiltonian neural network HNN is a multi-layered neural network with a particular loss function, based on a Hamiltonian value.

According to the invention, the Hamiltonian expression of the current function is used to derive therefrom the loss function used for learning the HNN neural network. In particular, the residues are derived from the Hamiltonian expression of the current function:

$$\begin{cases} \dfrac{dx}{dt} - \dfrac{d\psi}{dy} = 0 \\ \dfrac{dy}{dt} + \dfrac{d\psi}{dx} = 0 \end{cases}$$

And from there, a loss function L may be defined by the following expression:

$$\mathcal{L} = \left\| \frac{dx}{dt} - \frac{d\psi}{dy} \right\|^2 + \left\| \frac{dy}{dt} + \frac{d\psi}{dx} \right\|^2$$

This loss function is not calculated directly from the output $\psi$ of the neural network HNN but from the gradient $S_\psi$ of the output of the neural network.

In a practical way, the recent platforms implementing neural networks offer software interfaces making it possible to obtain intermediate information on the internal state of the neural network.

Notably, the methods of gradient recording ("gradient taping" according to the terminology of the software industry), self-differentiation modules of modern machine learning platforms (such as TensorFlow, PyTorch, etc.) allow the reuse of the gradients obtained during back-propagation learning (see, for example, https://www.tensorflow.org/guide/autodiff)

Also, the gradient $S_\psi$ is extracted from the neural network in order to allow the computation of the loss function L.

$$S_\psi = \begin{pmatrix} \dfrac{d\psi}{dy} \\ -\dfrac{d\psi}{dx} \end{pmatrix}$$

This extracted gradient corresponds, physically, to the symplectic gradient of the current function, i.e., to the velocity field $u=(u_x, u_y)$:

$$\begin{cases} \dot{x} = u_x = \dfrac{d\psi}{dy} \\ \dot{y} = u_y = -\dfrac{d\psi}{dx} \end{cases}$$

That is to say, one must be able to verify, in convergence $u=S_\psi$

The difference between the symplectic gradient $S_\psi$ at the output of the neural network and the velocity field $$u = (u_x, u_y) = \left( \frac{dx}{dt}, \frac{dy}{dt} \right)$$

therefore forms the error of the neural network evaluated by the loss function L.

The training may be performed by generating a training set extracted from the current function $\psi$. As has been seen, the value of the current function depends on the x,y coordinates and on the time t. random vectors (x, y) at fixed t may therefore be chosen and the value $\psi$ (x, y, t) as well as the velocities $\dot{x}$, $\dot{y}$, calculated by mathematical modeling, in particular on the basis of a physical model used in computational fluid dynamics, CFDs, such as those based on the Navier-Stokes equations and previously described.

As has been seen, the computations according to this type of model require a significant computation time and significant resources, but these computations aim to construct a training set and are not imputed on the time of the simulation itself: once it has been trained, the neural network HNN may be used for simulation without the impact of CFD simulation in terms of computational cost. In effect, the inference of a neural network has a constant cost, which does not depend on the complexity of the data.

Another advantage of the invention is to be independent of a discretization of the simulated space. In effect, it is possible to provide any x, y coordinates at the input of the neural network HNN and to obtain, by inference, an "interpolated" prediction of the current function and of the velocity field.

According to the invention, the multilayer neural network maintains a constant output corresponding to the total energy of the system, represented by the current function $\psi$.

The set of parameters of the network (forming the model itself) therefore runs through a set corresponding to a possible physical reality, i.e., the conservation of energy in the physical reality determined by the prediction of the neural network.

This is a substantial advantage over conventional neural networks, the learning of which is not constrained by a loss function informed by the physical reality.

In prediction, the neural network may be used by applying as input the x, y coordinates of a point in space for which it is desired to know the behavior of the flow, and in particular its velocity $\dot{x}$, $\dot{y}$.

Due to its training, the output of the neural network (i.e., the activation value of the neurons in the output layer) gives the value of the current function $\psi$. If a current line is run at point (x,y), the output of the neural network will therefore be constant.

It is also possible to access the temporal derivatives which are natively calculated by the Hamiltonian neural network, in the same way as during training. It is therefore possible to obtain, at the output of the neural network, both its "native" output, the current function, and its symplectic gradient $S_\psi$, i.e., the velocity field u.

Figure 4:
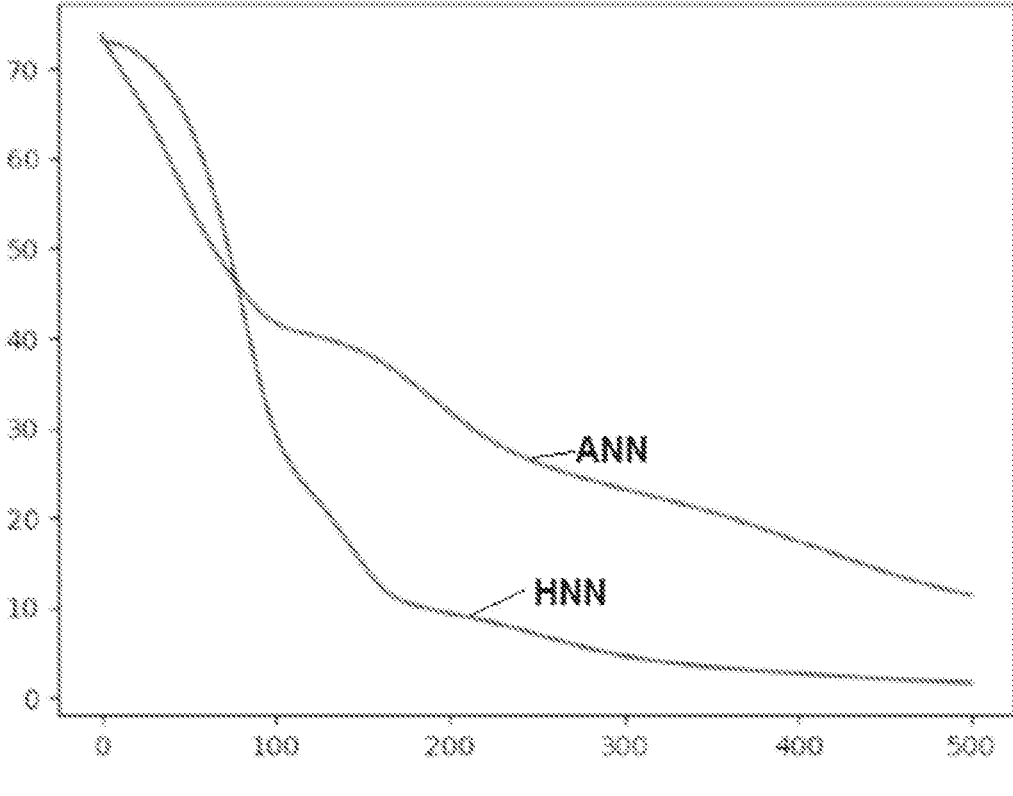
FIG. 4 illustrates the learning performance of a neural network according to an embodiment of the invention.

FIG. 4 illustrates the learning performance of a neural network according to an embodiment of the invention (HNN curve), based on the gradients of the current function, in comparison with a conventional neural network (ANN curve), i.e., using a loss function agnostic with respect to the physical reality and therefore based on an error measurement between a native output and an expected output. The ANN network has the same topology and therefore the same number of learned parameters, this makes it possible to measure the contribution of the Hamiltonian structure, all other things remaining equal.

One notices an appreciable gain in speed of convergence according to the number of examples provided (iterations). The error appears on the y-axis.

Figure 5:
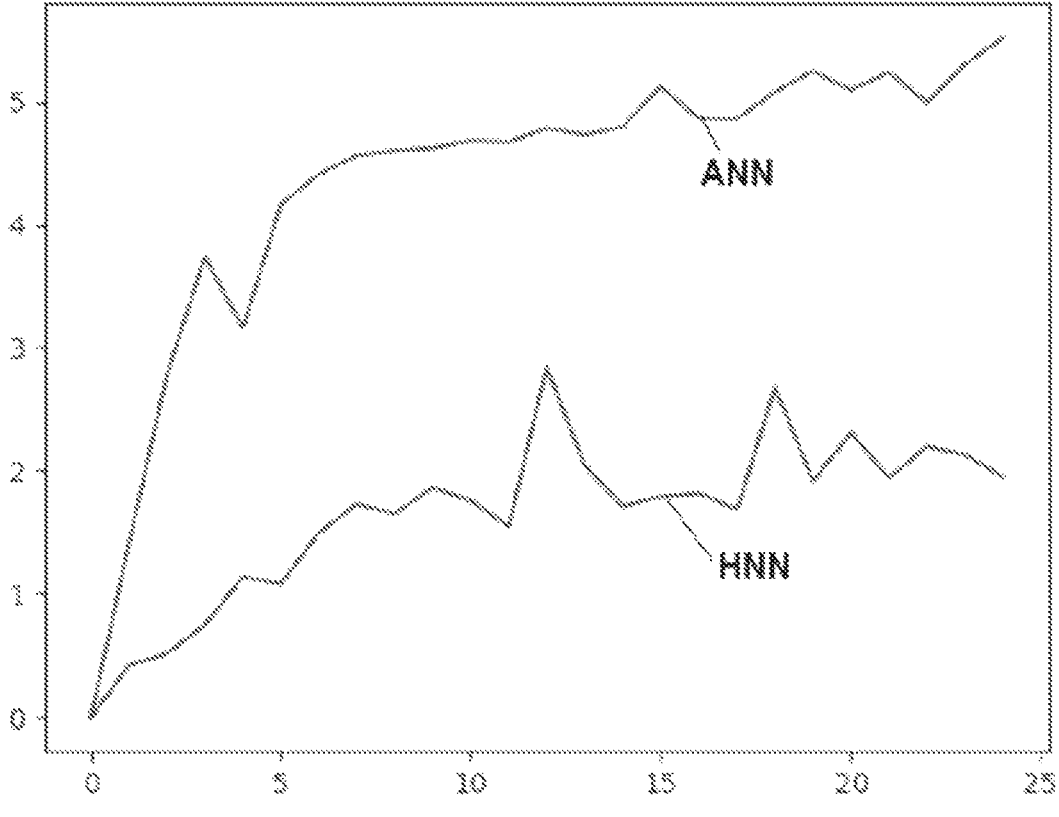
FIG. 5 illustrates the prediction performance of a neural network according to an embodiment of the invention.

FIG. 5 illustrates the prediction performances between these two neural networks (HNN and ANN curves). The test measures the evolution of the predictions over the iterations (on the x-axis) starting from initial conditions: it should be noted that the ANN curve diverges over the iterations and that the prediction of the network is associated with a growing error compared to a reality established by a conventional model based on computational fluid dynamics CFD. Conversely, the HNN curve shows a relatively stable error that is much lower than that obtained by the ANN network.

According to an embodiment of the invention, the neural network may be implemented in the form of a software module configured to interface with the simulation tools available on the market. According to another embodiment, the neural network is implemented in the form of an autonomous tool.

This module may be deployed on a server, on a group, or farm, of servers. It may also be accessible through a communication network such as the Internet, for example in the form of a service available via a computer cloud.

According to an embodiment, a server, or device, implementing the simulation method according to the invention, may comprise circuits and memories making it possible to store notably the computer code implementing the method, and in particular the neural network.

Thus, the invention makes it possible to avoid the computation at each iteration of the current function by the equations of computational fluid dynamics, CFD, during the simulation, by replacing this computation with the inference of a neural network which has the advantage of presenting a constant computational cost. In addition, according to the invention, this neural network takes physical reality into account in its very design, so that its performance in terms of the quality of predictions and in speed of convergence during learning is superior to that of the state of the art. Very high precisions are thus obtained while making it possible to reduce the computation time required for the simulation.

It is thus possible to simulate the behavior of complex physical systems in a reasonable time. The invention may in particular be applied to the simulation of aerial vehicles, such as airplanes, in the atmosphere, but also to any physical system that may be described by fluid dynamics, and in particular of parts, or elements, of these vehicles (wings, blades, etc.). As seen above, it may also be the simulation of meteorological systems, for example, or the behavior of ocean currents, or the behavior of a solid subsystem with respect to an environment made up of a fluid medium (wind turbine in the fluid medium of air, or other devices operating in a similar manner, i.e., with blades immersed in a flow of fluid: radial and axial compressors in aircraft turbojets, in air conditioning systems, in gas pipelines, in turbochargers, etc.)

In general, the term "circuit" is understood in this application as comprising hardware elements possibly associated with software elements insofar as certain hardware elements may be programmed. In particular, the term "circuit" comprises purely material implementations, in the form of specifically printed digital or analog circuits, implementations based, entirely or partially, on elements of the microprocessor or processor type, which are the subject of a programming by software instructions stored in one or more associated memories, etc. The software instructions may consist only of instructions necessary for basic processor operations (the "firmware") While the software instructions necessary for carrying out the functions of the embodiments of the invention may be stored either in these same memories associated with the processors, or in remote memories. In the latter case, these software instructions are only present in the circuit when the circuit is in operation to perform the functions according to the embodiments of the invention.

Of course, this invention is not limited to the examples and the embodiment described and shown but rather is defined by the claims. In particular, it is possible for the person skilled in the art to make numerous variations.

What is claimed is:

1. A method for simulating the behavior of a system (20) composed of a subsystem (10), in a physical environment (21) composed of an incompressible fluid, comprising:

training a multilayer neural network (HNN) by means of a training set associating coordinates (x, y) in said physical environment (21) and respective values of a gradient of the current function ($\psi$) at said coordinates (x,y), and a loss function configured to minimize an error between a gradient ($S_\psi$) of the output of said neural network and said gradient of the current function; and using said neural network to predict a value of a current function ($\psi$) and a velocity field (u) by providing it with input coordinates, wherein the training of the multilayer neural network comprises a back-propagation of the gradient of the error between the gradient ($S_\psi$) of the output of said neural network and said gradient of the current function in order to iteratively develop synaptic weights of the multilayer neural network.

2. The method according to claim 1, wherein said loss function (L) is expressed by:

$$\mathcal{L} = \left\| \frac{dx}{dt} - \frac{d\psi}{dy} \right\|^2 + \left\| \frac{dy}{dt} + \frac{d\psi}{dx} \right\|^2,$$

where t represents time.

3. The method according to claim 1, wherein said training set is generated by determining a value $\psi(x,y,t)$ of said current function, for coordinates, x,y chosen randomly and a fixed time t in said physical environment (21).

4. The method according to claim 3, wherein said value is determined on the basis of a physical model used in computational fluid dynamics, CFDs.

5. The method according to claim 4, wherein the subsystem comprises all or part of an aerial vehicle.

6. The method according to claim 5, wherein said aerial vehicle is an airplane.

7. A non-transitory computer-readable storage medium having a computer program comprising instructions stored thereon which, when executed by a computer, lead said computer to implement the method according to claim 1.

8. A device for simulating behavior of a system (20) composed of a subsystem (10), in a physical environment (21) composed of an incompressible fluid, comprising a means for:

training a multilayer neural network (HNN) by means of a training set associating coordinates (x, y) in said physical environment (21) and respective values of a gradient of a current function ($\psi$) at said coordinates (x,y), and a loss function configured to minimize an error between a gradient ($S_\psi$) of an output of said neural network and said gradient of the current function; and using said neural network to predict values of a current function ($\psi$) and of a velocity field (u) by providing it with input coordinates, wherein the training of the multilayer neural network comprises a back-propagation of the gradient of the error between the gradient ($S_\psi$) of the output of said neural network and said gradient of the current function in order to iteratively develop synaptic weights of the multilayer neural network.

9. The device according to claim 8, wherein said loss function (L) is expressed as:

$$\mathcal{L} = \left\| \frac{dx}{dt} - \frac{d\psi}{dy} \right\|^2 + \left\| \frac{dy}{dt} + \frac{d\psi}{dx} \right\|^2,$$

where t represents time.

10. The device according to claim 8, further comprising a means for generating said training set by determining a value $\psi(x,y,t)$ of said current function, for coordinates, x,y chosen randomly and a fixed time t in said physical environment (21).

11. The device according to claim 10, wherein said value is determined on the basis of a physical model used in computational fluid dynamics, CFD.

12. The device according to claim 11, wherein said subsystem is all or part of an aerial vehicle.

13. The device according to claim 12, wherein said aerial vehicle is an airplane.

14. The device according to claim 8, further comprising an interface for retrieving said coordinates and providing said values to a simulation tool.

15. A server, or set of servers, implementing a device according to claim 8, the server or set of servers comprising interfaces adapted to make the device accessible in a form of a service available via a computer cloud.

\* \* \* \* \*